United States Patent
Jin (10) Patent No.: US 12,236,146 B2
(45) Date of Patent: Feb. 25, 2025

(54) HPD CIRCUIT OF DISPLAY, WORKING METHOD, INTEGRATED CIRCUIT AND ELECTRONIC EQUIPMENT

(71) Applicants: QISDA (SUZHOU) CO., LTD., Jiangsu (CN); QISDA OPTRONICS (SUZHOU) CO. LTD., Jiangsu (CN)

(72) Inventor: Sanbao Jin, Suzhou (CN)

(73) Assignees: QISDA (SUZHOU) CO., LTD., Suzhou (CN); QISDA OPTRONICS (SUZHOU) CO. LTD., Suzhou (CN)

( * ) Notice: Subject to any disclaimer, the term of this patent is extended or adjusted under 35 U.S.C. 154(b) by 0 days.

(21) Appl. No.: 18/254,439

(22) PCT Filed: Apr. 26, 2022

(86) PCT No.: PCT/CN2022/089326
§ 371 (c)(1),
(2) Date: May 25, 2023

(87) PCT Pub. No.: WO2022/156833
PCT Pub. Date: Jul. 28, 2022

(65) Prior Publication Data
US 2024/0004599 A1    Jan. 4, 2024

(51) Int. Cl.
*G09G 5/00*  (2006.01)
*G06F 3/14*  (2006.01)
(Continued)

(52) U.S. Cl.
CPC .............. *G06F 3/14* (2013.01); *H03K 5/01* (2013.01); *H03K 17/6871* (2013.01); *H03K 2005/00019* (2013.01)

(58) Field of Classification Search
None
See application file for complete search history.

(56) References Cited

U.S. PATENT DOCUMENTS

| | | | |
|---|---|---|---|
| 2014/0071172 A1 | 3/2014 | Hussain et al. | |
| 2016/0163281 A1* | 6/2016 | Chandra | G09G 5/006 345/520 |

FOREIGN PATENT DOCUMENTS

| | | |
|---|---|---|
| CN | 109767743 A | 5/2019 |
| CN | 113359574 A | 9/2021 |

(Continued)

OTHER PUBLICATIONS

International Search Report issued on Dec. 16, 2022, in corresponding International Patent Application No. PCT/CN2022/089326; 5 pages.

*Primary Examiner* — Carl Adams
(74) *Attorney, Agent, or Firm* — Maier & Maier, PLLC (57) ABSTRACT

An HPD circuit of a display, a working method, an integrated circuit and electronic equipment, related to the field of display interfaces. The HPD circuit of a display includes a main control module configured to receive a first control signal from the display, generate a first detection signal based on the first control signal and output the first detection signal to a display interface; and a delay control module configured to receive a second control signal from the display, generate a second detection signal based on the second control signal, set the second detection signal to a high level, and output the second detection signal to the display interface. According to the embodiments, the software delay of a display can be effectively shortened, and an HPD signal can be set to a high level as soon as possible.

13 Claims, 3 Drawing Sheets

(51) Int. Cl.
  *H03K 5/01* (2006.01)
  *H03K 17/687* (2006.01)
  *H03K 5/00* (2006.01)

(56) References Cited

FOREIGN PATENT DOCUMENTS

| | | |
|---|---|---|
| CN | 114220372 A | 3/2022 |
| CN | 215933160 U | 3/2022 |
| JP | 2014197259 A | 10/2014 |

* cited by examiner

HPD CIRCUIT OF DISPLAY, WORKING METHOD, INTEGRATED CIRCUIT AND ELECTRONIC EQUIPMENT

TECHNICAL FIELD

The application relates to the technical field of display interfaces, in particular to an HPD circuit of a display, a working method, an integrated circuit and electronic equipment.

BACKGROUND

At present, a hot plug detect (HPD) circuit of a display controls the level of an HPD signal through a control signal. When the HPD signal is at a high level, the display normally displays a Basic Input Output System (BIOS) screen.

When a computer host and the display share a same power system, a BIOS needs to configure the output of a graphics card after the computer host is started, but a driver of the graphics card has not been loaded yet. In an output interface of a Display Port interface, the BIOS cannot perform interrupt processing, thus failing to respond to the state change of the display interface, and the Display Port interface cannot set the HPD signal to a high level immediately, as a result, the computer host cannot output the BIOS screen to the display.

Due to the different architectures of the power supply and the display, there are hardware delay of the power system and software delay of the display. If the hardware delay and software delay are long, the above problems will occur. Because there is little room for improving the hardware delay of the power system and the improvement cost is high, a solution commonly used at present is to minimize the software delay of the display, which is generally realized by optimizing the initialization process of software and adjusting the timing control of submodules, but the improvement method is complicated and requires repeated verification.

SUMMARY

The application provides an HPD circuit of a display, a working method, an integrated circuit and electronic equipment. By adding a delay control circuit to improve an HPD control circuit, the complexity in software improvement in the prior art can be effectively avoided, and an HPD signal is set to a high level as soon as possible to realize the normal display of a BIOS screen.

According to one aspect of the application, an HPD circuit of a display is provided, comprising: a main control module configured to receive a first control signal from the display, generate a first detection signal based on the first control signal and output the first detection signal to a display interface; and a delay control module configured to receive a second control signal from the display, generate a second detection signal based on the second control signal, set the second detection signal to a high level, and output the second detection signal to the display interface.

According to some embodiments, the first control signal and the second control signal are sent out at a same time after the display is power on; the first control signal and the second control signal are both at a low level before the first detection signal is set to a high level; the first control signal and the second control signal are both at a high level after the first detection signal is set to a high level; and the second control signal maintains a high level state after the first detection signal is set to a high level.

According to some embodiments, under a condition that the first control signal and the second control signal are both at a low level, the delay control module operates; and under a condition that the first control signal and the second control signal are both at a high level, the delay control module is turned off.

According to some embodiments, the main control module comprises a first resistor, a third resistor and a first access port; the first access port is electrically connected with an HPD receiving pin of the display interface through the third resistor and receives the first control signal; and the first resistor is grounded, and the HPD receiving pin of the display interface is grounded through the first resistor.

According to some embodiments, the delay control module comprises a first switch submodule and a second switch submodule, and the first switch submodule is electrically connected with the second switch submodule.

According to some embodiments, the first switch submodule comprises a power supply, a first MOS switch tube, a first switch tube, a second resistor, a fifth resistor, a sixth resistor and a second access port; the second access port is electrically connected with a base of the first switch tube through the sixth resistor and receives the second control signal; the base of the first switch tube serves as a control port of the first switch tube and is grounded through the fifth resistor; an emitter of the first switch tube serves as an input port of the first switch tube and is electrically connected with a drain of the first MOS switch tube; a collector of the first switch tube serves as an output port of the first switch tube and is electrically connected with the display interface through the second resistor; and a source of the first MOS switch tube is electrically connected with the power supply, and a gate of the first MOS switch tube is electrically connected with a collector of a second switch tube of the second switch submodule.

According to some embodiments, when the first MOS switch tube is in an off state, the emitter of the first switch tube is reversely biased, so that the first switch tube is in the off state; when the first MOS switch tube is in a saturated on state and the second control signal is at a low level, the emitter of the first switch tube is forward biased, and the second resistor, the fifth resistor and the sixth resistor are adjusted to make the first switch tube in an on state, so that the delay control module sets the second detection signal to a high level based on the second control signal; and when the first MOS switch tube is in a saturated on state and the second control signal is at a high level, the emitter of the first switch tube is reversely biased, so that the first switch tube is in an off state.

According to some embodiments, the second switch submodule comprises a power supply, a fourth resistor, a seventh resistor, an eighth resistor, a second switch tube, a first capacitor and a second capacitor; a base of the second switch tube is grounded through the first capacitor and the fourth resistor, and the base of the second switch tube serves as a control port of the second switch tube; a collector of the second switch tube serves as an output port of the second switch tube, and the collector of the second switch tube is electrically connected with a gate of the first MOS switch tube of the first switch submodule; an emitter of the second switch tube is grounded, and is connected with the power supply and a source of the first MOS switch tube of the first switch submodule through the second capacitor; and the power supply is electrically connected with a collector of the second switch tube through the eighth resistor, and is electrically connected with the base of the second switch tube through the seventh resistor.

According to some embodiments, when the second switch tube is in an off state, the first MOS switch tube is in an off state; when the second switch tube is in a saturated on state, the first MOS switch tube is in an on state; an on-time of the second switch tube is controlled by a control port of the second switch tube, and a working time of the delay control module is controlled by using the on-time of the second switch tube.

According to some embodiments, the working time of the delay control module comprises: time for the delay control module to set the second detection signal to a high level after the display is power on; and time from a moment that the second detection signal is set to a high level to a moment that the first detection signal is set to a high level.

According to one aspect of the application, a working method applied to an HPD circuit of a display is provided, the circuit comprises a main control module and a delay control module, wherein the method comprises: determining a working state of the delay control module according to a level of a first control signal and/or a second control signal sent from the display; controlling the delay control module to generate and output a second detection signal according to the second control signal when the delay control module is in a working state; and controlling the main control module to generate and output a first detection signal according to the first control signal when the delay control module is in an off state.

According to some embodiments, the delay control module sets the level of the second detection signal to a high level when the delay control module operates, and the main control module sets the level of the first detection signal to a high level when the delay control module is turned off.

According to some embodiments, controlling the delay control module to generate and output a second detection signal according to the second control signal sent out by the display when the delay control module is in a working state comprises: adjusting a resistance value of at least one resistor in the delay control module, so that the delay control module is in a saturated on state; generating and outputting the second detection signal; and adjusting a capacitor in the delay control module to control the working time of the delay control module.

According to one aspect of the application, an integrated circuit is provided, comprising the HPD circuit as described above.

According to one aspect of the application, an electronic device is provided, comprising the HPD circuit or the integrated circuit as described above.

According to the embodiments of the application, on the basis of effective communication between a computer host and a Display Port display, the software delay of the display can be minimized, and an HPD signal can be set to a high level as soon as possible, thus effectively solving the problem that a BIOS screen cannot be displayed normally.

It should be understood that the above general description and the following detailed description are only exemplary, and do not limit the application.

BRIEF DESCRIPTION OF THE DRAWINGS

In order to more clearly explain the technical solutions in the embodiments of this application, the drawings needed in the description of the embodiments will be briefly introduced below. Obviously, the drawings in the following description are only some embodiments of this application.

DETAILED DESCRIPTION OF EMBODIMENTS

Exemplary embodiments will be described more fully below with reference to the accompanying drawings. However, the exemplary embodiments can be implemented in various forms and should not be construed as limited to the embodiments set forth herein. These embodiments are provided to make this application more thorough and complete, and to fully convey the concept of the exemplary embodiments to those skilled in the art. In the drawings, the same reference numerals refer to the same or similar parts, so repeated descriptions will be omitted.

The described features, structures, or characteristics may be combined in any suitable manner in one or more embodiments. In the following description, numerous specific details are provided to give a thorough understanding of the embodiments of the application. However, those skilled in the art will realize that the technical solution of the application can be practiced without one or more of these specific details, or other ways, components, materials, devices or operations can be adopted. In these cases, well-known structures, methods, devices, implementations, materials or operations will not be shown or described in detail.

The flowchart shown in the drawings is only an exemplary illustration, and does not necessarily include all contents and operations/steps, nor does it have to be executed in the described order. For example, some operations/steps can be decomposed, while some operations/steps can be combined or partially combined, so the actual execution order may change according to the actual situation.

Terms such as "first" and "second" in the specification and claims of this application and the drawings are used to distinguish different objects, but not to describe a specific order. Further, the terms "comprise" and "have" and any variations thereof are intended to cover non-exclusive inclusion. For example, a process, method, system, product or device comprising a series of steps or units is not limited to the listed steps or units, but optionally comprises steps or units not listed, or optionally comprises other steps or units inherent to the process, method, product or device.

The application provides an HPD circuit of a display, a working method, an integrated circuit and electronic equipment. An HPD signal delay control circuit is added to a Display Port display, which can effectively adjust and shorten the software delay of the display, and set an HPD signal to a high level as soon as possible, so that a BIOS screen can be displayed normally.

The HPD circuit of a display, the working method, the integrated circuit and the electronic equipment according to the embodiments of the application will be described in detail below with reference to the attached drawings.

Figure 1:
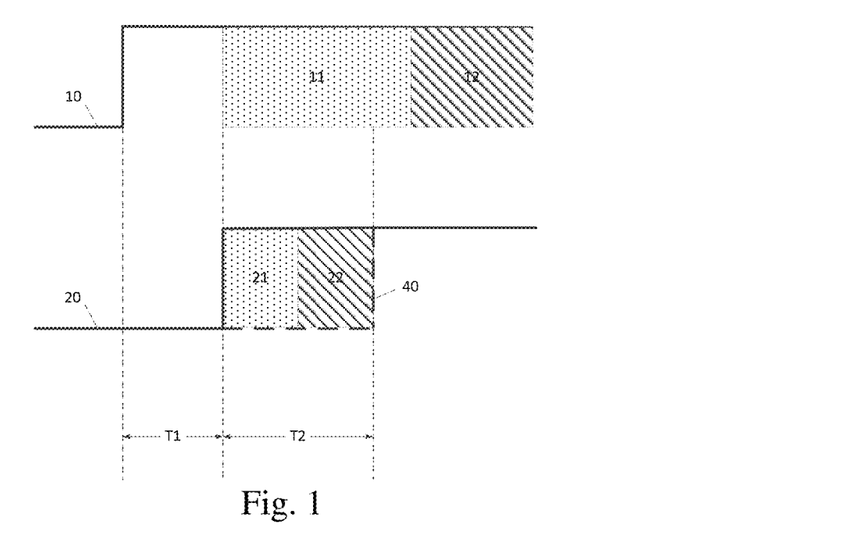
FIG. 1 shows a timing diagram of a power supply signal and an HPD signal in the prior art.

FIG. 1 shows a timing diagram of a power supply signal and an HPD signal in the prior art.

As shown in FIG. 1, 10 is a signal for a power system to supply power to a computer host, comprising a BIOS startup period 11 and an operating system startup period 12.

20 is a signal for the power system to supply power to a display using a Display Port interface, comprising an initialization period 21 of each module of the display and a timing control period 22 of each module.

40 is an HPD signal of the display.

T1 is hardware delay of the power system, comprising a time difference $T_{EPS}$ (External Power Supply, EPS) between outputs provided by the computer host and an external power supply of the display, and a time difference $T_{IPS}$ (Internal Power Supply, IPS) between an AC/DC voltage conversion module of the display performing AC/DC voltage conversion and providing a converted DC voltage to a display control module, that is, the hardware delay T1 of the power system is $T_{EPS}+T_{IPS}$.

T2 is software delay of the display, which is a time period for the display to complete the initialization and timing control of each module before the display control module drives the HPD signal.

After the computer host receives power output by the power system, the signal 10 becomes a high level. After the hardware delay T1 of the power system, the computer host starts a BIOS and outputs a BIOS screen, and starts an operating system and outputs an operating system screen after the BIOS startup is completed.

After the display receives power output by the power system and after the hardware delay T1 of the power system, the signal 20 becomes a high level, the display starts the initialization and timing control of each module in turn, and the duration is the software delay T2 of the display.

The display control module outputs a control signal to control the HPD circuit to generate and output the HPD signal 40. When the display starts the initialization of each module, the level of the HPD signal 40 is the same as that of the control signal, which is low.

After the software delay T2 of the display, that is, after the display completes the initialization and timing control of each module, the HPD signal 40 is set to a high level by the control signal through the HPD circuit, and the display starts to receive the BIOS screen and the operating system screen output by the computer host in turn and display them.

Due to the existence of the hardware delay T1 of the power system and the software delay T2 of the display, the display cannot display the BIOS screen normally.

Figure 2:
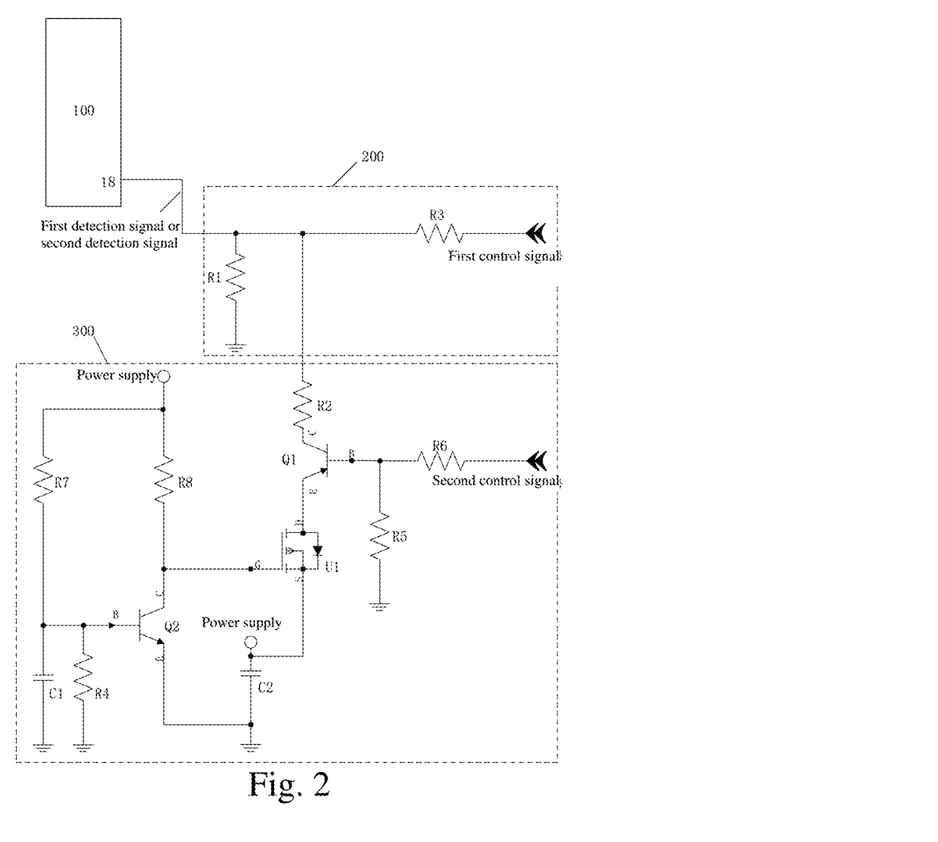
FIG. 2 shows a circuit diagram of an HPD circuit of a display according to a first embodiment of the application.

FIG. 2 shows a circuit diagram of an HPD circuit of a display according to a first embodiment of the application.

As shown in FIG. 2, an HPD circuit of a display in the first embodiment of the application comprises a display interface (such as a Display Port) 100, a main control module 200 and a delay control module 300, and the display interface 100, the main control module 200 and the delay control module 300 are all on a display side.

The display interface 100 comprises an HPD receiving pin 18 for receiving a first detection signal output by the main control module 200 or a second detection signal output by the delay control module 300.

According to some embodiments, the display interface 100 receives the first detection signal or the second detection signal through the HPD receiving pin 18 and transmits the first detection signal or the second detection signal to the computer host, and the computer host determines whether to output the BIOS screen to the display according to the level of the first detection signal or the second detection signal.

Generally, when the level of the first detection signal or the second detection signal is high, the display displays the BIOS screen; and when the level of the first detection signal or the second detection signal is low, the display does not display the BIOS screen.

The main control module 200 comprises a resistor R1, a resistor R3 and an access port of a first control signal.

The access port of the first control signal is electrically connected with the HPD receiving pin 18 of the display interface 100 through the resistor R3, and receives the first control signal.

One end of the resistor R1 is electrically connected with the HPD receiving pin 18, and the other end is grounded.

According to some embodiments, the first control signal is output by the display control module, and when the level of the first control signal is high, the timing of the first detection signal generated and output via the main control module 100 is the same as that of the first control signal.

The delay control module 300 comprises a first switch submodule and a second switch submodule, and the first switch submodule and the second switch submodule are electrically connected.

The first switch submodule comprises a power supply (VDD_DP 3V3), a first MOS switch tube U1, a first switch tube Q1, a resistor R2, a resistor R5, a resistor R6 and an access port of a second control signal.

The second switch submodule comprises a power supply (VDD_DP 3V3), a second switch tube Q2, a resistor R4, a resistor R7, a resistor R8, a capacitor C1 and a capacitor C2.

In the first switch submodule, the access port of the second control signal is connected with a base B of the first switch tube Q1 through the resistor R6 for receiving the second control signal.

According to some embodiments, both the first control signal and the second control signal are output by the display control module, and the level of the first control signal and the level of the second control signal are both low or high.

When the level of the first control signal and the level of the second control signal are both low, the delay control module 300 operates, and the HPD receiving pin 18 receives the second detection signal output through the first switch submodule.

When the level of the first control signal and the level of the second control signal are both high, the delay control module 300 is turned off, and the HPD receiving pin 18 receives the first detection signal output through the main control module 200.

The base B of the first switch tube Q1 serves as a control port of the first switch tube Q1 and is grounded through the resistor R5.

An emitter E of the first switch tube Q1 serves as an input port of the first switch tube Q1 and is connected with a drain D of the first MOS switch tube U1.

A collector C of the first switch tube Q1 serves as an output port of the first switch tube Q1 and is electrically connected with the HPD receiving pin 18 of the display interface 100 through the resistor R2, and the delay control module 300 outputs the second detection signal to the display interface 100 through the output port of the first switch tube Q1.

A gate G of the first MOS switch tube U1 is electrically connected with a collector C of the second switch tube Q2.

A source S of the first MOS switch tube U1 is connected with the power supply, and is connected with an emitter E of the second switch tube Q2 through the capacitor C2.

A drain D of the first MOS switch tube U1 is connected with the input port of the first switch tube Q1 (that is, the emitter E of the first switch tube Q1).

According to some embodiments, the first MOS switch tube U1 is a P-channel MOS transistor, comprising an off state and a saturated on state.

When the first MOS switch tube U1 is in an off state, the emitter of the first switch tube Q1 is reversely biased, so that the first switch tube Q1 is in an off state.

When the first MOS switch tube U1 is in a saturated on state, the first switch tube Q1 is in an on or off state according to the low or high level of the second control signal.

When the first MOS switch tube U1 is in a saturated on state and the level of the second control signal is low, the emitter of the first switch tube Q1 is forward biased, and the collector of the first switch tube Q1 is forward biased by adjusting the resistance values of the resistors R2, R5 and R6, so that the first switch tube Q1 is in an on state, and the delay control module 300 operates.

When the first MOS switch tube U1 is in a saturated on state and the level of the second control signal is high, the emitter of the first switch tube Q1 is reversely biased, so that the first switch tube Q1 is in an off state, and the delay control module 300 is turned off.

Further, the delay control module 300 sets the level of the second detection signal to a high level based on the second control signal in a working state.

For example, the on voltage $U_{BE(sat)}$ of the emitter of the first switch tube Q1 is 0.7 V, the DC amplification factor $\beta=100$, the saturation voltage $U_{CE(sat)}$ is 0.4 V, the resistance R2=10 KΩ, the resistance R5=20 KΩ, the resistance R6=1 KΩ, the resistance R3=100Ω, the resistance R1=100 KΩ, the voltage of the power supply (VDD_DP3V3) is 3.3 V, and the saturation on-resistance $R_{DS(on)}$ of the first MOS switch U1 is 80 mΩ, which can be ignored because it is very small.

The high level of the second control signal is +3.3 V, and the low level is 0 V. When the level of the second control signal is high, the emitter of the first switch tube Q1 is reversely biased, so that the first switch tube Q1 is turned off, and a circuit of the main control module 200 is not affected by a circuit of the delay control module 300.

When the level of the second control signal is low, the base current of the first switch tube Q1

$$I_{B1}=(VDD\_DP3V3-U_{BE(sat)})(R5//R6)\approx(3.3-0.7)/1000=2.6 \text{ mA}.$$

Assuming that the first switch tube Q1 is in a saturated state, then
$I_{C1}/\beta=(VDD\_DP3V3-U_{CE(sat)})/[(R2+R1/R3)\beta]\approx(3.3-0.4)/(10K\times100)=2.9$ uA, $I_{C1}/\beta<I_{B1}$, and based on this assumption, the first switch tube Q1 is in a saturated on state, the delay control module 300 operates, and the level of the second detection signal is set to a high level by the delay control module 300.

In the second switch submodule, a base B of the second switch tube Q2 serves as a control port of the second switch tube Q2, which is connected with the power supply through the resistor R7 and grounded through the capacitor C1 and the resistor R4.

An emitter E of the second switch tube Q2 is grounded, and is connected with the power supply and the source S of the first MOS switch tube U1 in the first switch submodule through the capacitor C2.

A collector C of the second switch tube Q2 serves as an output port of the second switch tube Q2 and is connected with the power supply through the resistor R8, and the collector C of the second switch tube Q2 is electrically connected with the gate G of the first MOS switch tube U1 in the first switch submodule.

According to some embodiments, the second switch tube Q2 has an off state and a saturated on state.

When the second switch tube Q2 is in an off state, the output port (collector C) of the second switch tube Q2 controls the gate G of the first MOS switch tube U1, and the voltage of an electrode of the first MOS switch tube U1 $U_{GS}>U_{GSth}$, so that the first MOS switch tube U1 is in an off state.

When the second switch tube Q2 is in a saturated on state, the output port (collector C) of the second switch tube Q2 controls the gate G of the first MOS switch tube U1, and the voltage of the electrode of the first MOS switch tube U1 $U_{GS}<U_{GSth}$, so that the first MOS switch tube U1 is in an on state.

Further, the on-time of the second switch tube Q2 can be controlled by adjusting the control port of the second switch tube Q2, thereby controlling the working time of the delay control module 300.

For example, the on voltage $U_{BE(sat)}$ of the emitter of the second switch tube Q2 is 0.7 V, the DC amplification factor $\beta=100$, the saturation voltage $U_{CE(sat)}$ is 0.4 V, the resistor R4=20 KΩ, the resistor R7=10 KΩ, the capacitor C1=10 uF, the resistor R8=100 KΩ, the capacitor C2=0.1 uF, and the threshold voltage of the first MOS switch tube U1 $U_{GSth}=-0.8$ V.

Assuming that $V_0$ is the initial voltage value of the capacitor C1, $V_1$ is the voltage value that the capacitor C1 can finally be charged to, and $V_t$ is the voltage value of the capacitor C1 at time t, then $$V_0=0V, V_1=VDD\_DP3V3*R4/(R4+R7)=3.3*20K/(20K+10K)=2.2V, V_t=U_{BE(sat)}=0.7V,$$

therefore $t=(R4//R7)*C1*Ln[(V_1-V_0)/(V_1-V_t)]=6.67K*10$ uF$*Ln[2.2/(2.2-0.7)]\approx6.67K*10$ uF$*0.39=26$ ms, that is, after about 26 ms, the emitter of the second switching transistor Q2 is turned on, and at this point, the base current of the second switch tube Q2

$$I_{B2}=(VDD\_DP3V3-U_{BE(sat)})/R7-U_{BE(sat)}/R4=(3.3-0.7)/10K-0.7/20K=0.26 \text{ mA}-0.035 \text{ mA}=0.225 \text{ mA}.$$

Assuming that the second switch tube Q2 is in a saturated on state, then
$I_{C2}/\beta=(VDD\_DP3V3-U_{CE(sat)})/(R8*\beta)=(3.3-0.4)/(100K*100)=0.29$ uA, $I_{C2}/\beta<I_{B2}$, and based on this assumption, the second switch tube Q2 is in a saturated on state.

When the second switch tube Q2 is in a saturated on state, for the first MOS switch tube U1, $U_{GS}=(0.4V-3.3V)=-2.9V<U_{GSth}$, and the first MOS switch tube U1 is in an on state.

According to the embodiment of the application, t can be changed by adjusting the capacitor C1, and then the on-time of the second switch tube Q2 can be changed, thus realizing the control of the working time of the delay control module 300.

Figure 3:
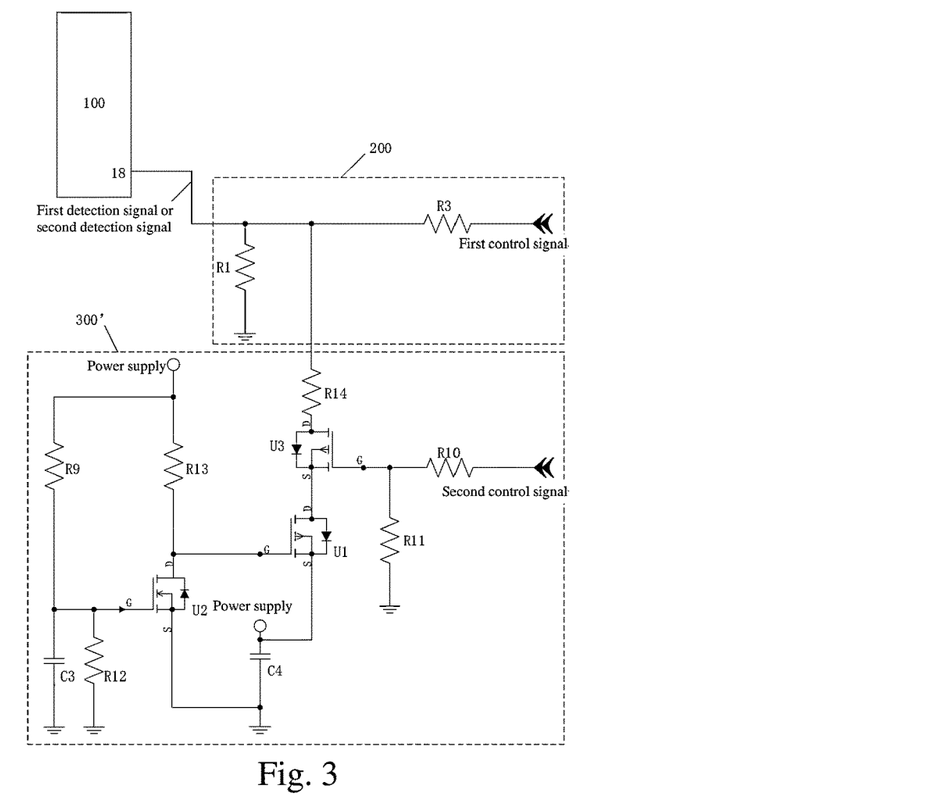
FIG. 3 shows a circuit diagram of an HPD circuit of a display according to a second embodiment of the application.

FIG. 3 shows a circuit diagram of an HPD circuit of a display according to a second embodiment of the application.

As shown in FIG. 3, an HPD circuit of a display in the second embodiment of the application comprises a display interface 100, a main control module 200 and a delay control module 300', and the display interface 100, the main control module 200 and the delay control module 300' are all on a display side.

The display interface 100 and the main control module 200 in the second embodiment are the same as those in the first embodiment in terms of composition and connection mode, and will not be described here again.

The delay control module 300' in the second embodiment comprises a third switch submodule and a fourth switch submodule, and the third switch submodule and the fourth switch submodule are electrically connected.

The third switch submodule comprises a power supply (VDD_DP 3V3), a first MOS switch tube U1, a third MOS switch tube U3, a resistor R10, a resistor R11, a resistor R14 and an access port of a second control signal.

The fourth switch submodule comprises a power supply (VDD_DP 3V3), a second MOS switch tube U2, a resistor R9, a resistor R12, a resistor R13, a capacitor C3 and a capacitor C4.

In the third switch submodule, the access port of the second control signal is connected with a gate G of the third MOS switch tube U3 through the resistor R10 for receiving the second control signal.

The gate G of the third MOS switch tube U3 serves as a control port of the third MOS switch tube U3 and is grounded through the resistor R11.

A source S of the third MOS switch tube U3 serves as an input port of the third MOS switch tube U3 and is connected with the drain D of the first MOS switch tube U1.

A drain D of the third MOS switch tube U3 serves as an output port of the third MOS switch tube U3, and is electrically connected with the HPD receiving pin 18 of the display interface 100 through the resistor R14. The delay control module 300' outputs the second detection signal to the display interface 100 through the output port of the third MOS switch tube U3.

The gate G of the first MOS switch tube U1 is electrically connected with the drain D of the second MOS switch tube U2.

The source S of the first MOS switch tube U1 is connected with the power supply, and is connected with the source S of the second MOS switch tube U2 through the capacitor C4.

The drain D of the first MOS switch tube U1 is connected with an input port of the third MOS switch tube U3 (that is, a source S of the third MOS switch tube U3).

In the fourth switch submodule, the gate G of the second MOS switch tube U2 serves as the control port of the second MOS switch tube U2, which is connected with the power supply through the resistor R9 and grounded through the capacitor C3 and the resistor R12.

The source S of the second MOS switch tube U2 is grounded, and is connected with the power supply and the source S of the first MOS switch tube U1 through the capacitor C4.

The drain D of the second MOS switch tube U2 serves as the output port of the second MOS switch tube U2 and is connected with the power supply through the resistor R13, and the drain D of the second MOS switch tube U2 is electrically connected with the gate G of the first MOS switch tube U1.

According to the embodiment of the application, in the second embodiment, a P-channel MOS switch tube is used to replace the first switch tube in the first embodiment, and an N-channel MOS switch tube is used to replace the second switch tube in the first embodiment. By adjusting elements such as resistors and capacitors, the same effect as that in the first embodiment can be obtained.

Figure 4:
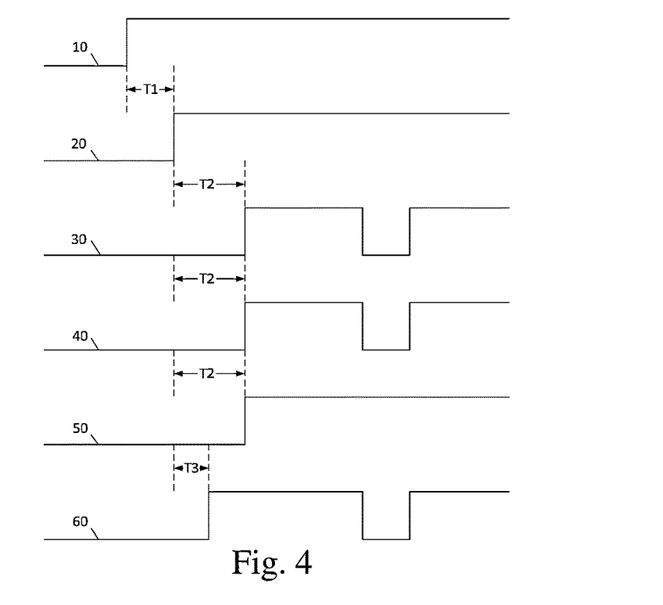
FIG. 4 shows a timing diagram of an HPD signal according to an embodiment of the application.

FIG. 4 shows a timing diagram of an HPD signal according to an embodiment of the application.

As shown in FIG. 4, a signal 10 is a power signal on a computer host side, a signal 20 is a power signal on a display side, a signal 30 is a first control signal, a signal 40 is a first detection signal output by a main control module, a signal 50 is a second control signal, and a signal 60 is a second detection signal output by a delay control module.

The first control signal and the second control signal are both control signals, which are connected to a GPIO port of a display control module, set to a high level or low level by the display control module, and started at the same time.

T1 is hardware delay of a power system, comprising time delay $T_{EPS}$ between AC input and AC output of a power supply of the computer host and time delay $T_{IPS}$ between AC input and DC output of a power supply of the display.

T2 is software delay of the display, which is a time period from the moment a mainboard of the display is power on and then performs initialization of each module to the moment the level of the first control signal and the level of the second control signal are controlled to be high.

T3 is a time for an HPD signal (i.e., the second detection signal) of a display interface to be set to a high level through a circuit of a delay control module of the embodiment of the application after the display is power on, and T3<T2.

According to some embodiments, T3 can be changed by adjusting the on-time of the circuit of the delay control module.

After the computer host receives power output by the power system, the signal 10 becomes a high level. After the hardware delay T1 of the power system, the computer host starts a BIOS and outputs a BIOS screen.

After the display receives power output by the power system and after the hardware delay T1 of the power system, the signal 20 becomes a high level, and the display starts the initialization and timing control of each module in turn.

The display control module outputs the signal 30 and the signal 50 at the same time, and the signal 40 is output through the main control module. When the display starts the initialization and timing control of each module, the level of the signal is the same as that of the signal 30 and that of the signal 50, which is low. At this point, the delay control module starts to operates according to the level of the signal 50.

After T3, the signal 60 is set to a high level by the delay control module based on the signal 50, and the display completes the initialization and timing control of each module and starts to display the BIOS screen.

As shown in FIG. 4, in the prior art, the signal 30 (the control signal of the main control module, i.e. the first control signal) and the signal 40 (the HPD signal of the display interface, i.e. the first detection signal) can only be set from a low level or high impedance to a high level after T2, because the long T2 affects the communication between the computer host and the display.

In this embodiment of the application, the circuit of the delay control module operates when the signal 50 (the control signal of the delay control module, i.e. the second control signal) is in a low-level or high-impedance state, and the signal 60 (the HPD signal of the display interface, i.e. the second detection signal) can be set to a high level simply after T3, so that the display displays the BIOS screen of the computer host; and T3 is much smaller than T2, thus greatly improving the speed of displaying the BIOS screen compared with the prior art.

When the signal 50 (the control signal of the delay control module, i.e. the second control signal) remains at a high level after T2, the circuit of the delay control module in this embodiment of the application is turned off in a high-impedance state, so that the operation of the original circuit is not affected, and the signal 40 (the HPD signal of the display interface, i.e. the first detection signal) is only controlled by the signal 30 (the control signal of the main control module, that is, the first control signal) of the original control circuit.

Figure 5:
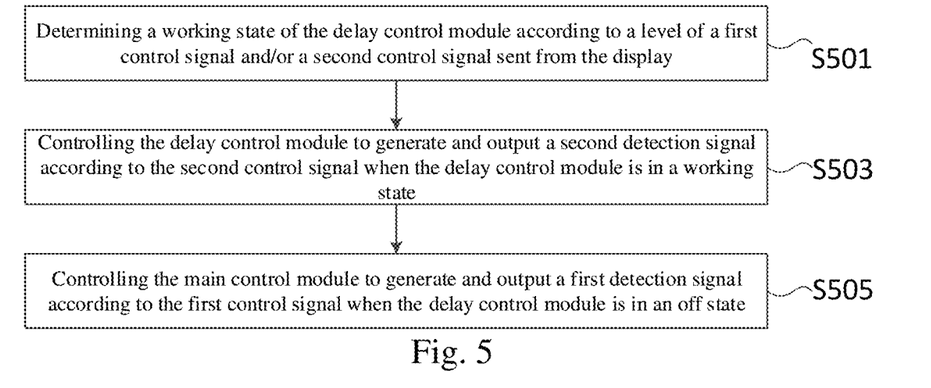
FIG. 5 shows a flowchart of a working method applied to an HPD circuit of a display according to an embodiment of the application.

FIG. 5 shows a flowchart of a working method applied to an HPD circuit of a display according to an embodiment of the application.

As shown in FIG. 5, in S501, the working state of the delay control module is determined according to the level of the first control signal and/or the second control signal sent from the display.

According to some embodiments, the first control signal and the second control signal are output by the display control module and can be set to a high level or a low level by software.

The first control signal is connected to the circuit of the main control module through a first access port of the main control module, and the second control signal is connected to the circuit of the delay control module through a second access port of the delay control module.

According to some embodiments, under the condition that the first control signal and the second control signal are both at a low level, the delay control module operates; and under the condition that the first control signal and the second control signal are both at a high level, the delay control module is turned off.

In S503, the delay control module is controlled to generate and output the second detection signal according to the second control signal when the delay control module is in a working state.

According to the first embodiment of the application, the delay control module is in a working state, and the first switch tube Q1 in its circuit is in a saturated on state. According to the second control signal of the control port of the first switch tube Q1, the delay control module sets the second detection signal to a high level and outputs it to the display interface through the output port of the first switch tube Q1.

In S505, the main control module is controlled to generate and output the first detection signal according to the first control signal when the delay control module is in an off state.

According to the first embodiment of the application, the delay control module is in an off state, and the first switch tube Q1 in its circuit is in an off state, so that the circuit of the delay control module will not affect the circuit of the main control module.

The main control module sets the first detection signal to a high level according to the first control signal received by the first access port and outputs it to the display interface.

According to some embodiments, the display sends the first detection signal or the second detection signal to the computer host, and displays the BIOS screen output by the computer host to the display when the level of the first detection signal or the second detection signal is high.

Figure 6:
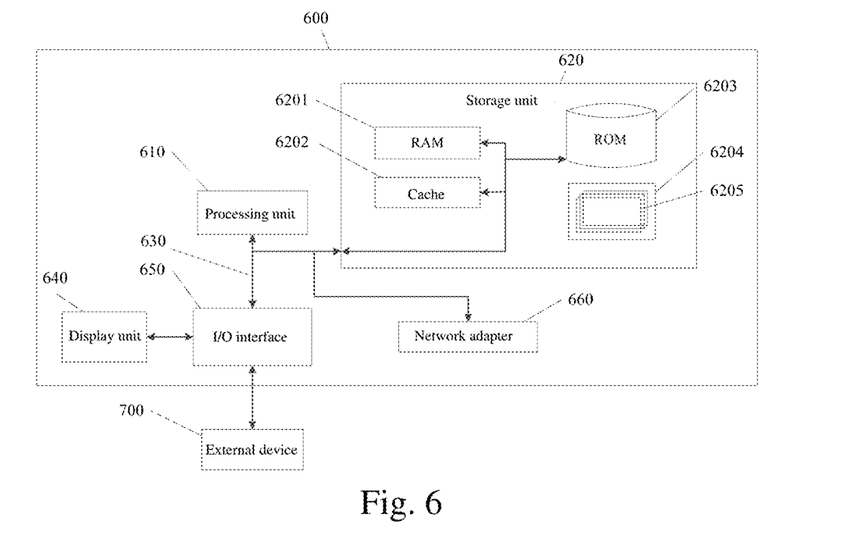
FIG. 6 shows a block diagram of electronic equipment according to an exemplary embodiment of the application.

FIG. 6 shows a block diagram of electronic device according to an exemplary embodiment of the application.

As shown in FIG. 6, electronic device 600 is just an example, and should not bring any limitation to the function and application scope of the embodiments of the application.

As shown in FIG. 6, the electronic device 600 is represented in the form of general-purpose computing equipment. Components of the electronic equipment 600 may include, but are not limited to, at least one processing unit 610, at least one storage unit 620, a bus 630 connecting different system components (including the storage unit 620 and the processing unit 610), a display unit 640, and the like, wherein the storage unit stores a program code, and the program code can be executed by the processing unit 610, so that the processing unit 610 implements the methods described in this specification according to various exemplary embodiments of the application. For example, the processing unit 610 may implement the method as shown in FIG. 5.

The storage unit 620 may include a computer-readable medium in the form of a volatile memory, such as a random access memory (RAM) 6201 and/or a cache memory 6202, and may further include a read-only memory (ROM) 6203.

The storage unit 620 may also comprise a program/utility tool 6204 with a group of (at least one) program modules 6205, such program modules 6205 include but are not limited to: an operation system, one or more application programs, other program modules and program data, and each or some combination of these examples may include the implementation of a network environment.

The bus 630 may represent one or more of several types of bus structures, including memory cell bus or memory cell controller, peripheral bus, graphics acceleration port, processing unit or local bus using any of a variety of bus structures.

The electronic device 600 can also communicate with one or more external devices 700 (e.g., keyboard, pointing device, Bluetooth device, etc.), with one or more devices that enable users to interact with the electronic device 600, and/or with any device that enables the electronic device 600 to communicate with one or more other computing devices (e.g., routers, modems, etc.). This communication can be performed through an input/output (I/O) interface 650. Further, the electronic device 600 can also communicate with one or more networks (such as a local area network (LAN), a wide area network (WAN) and/or a public network, such as the Internet) through a network adapter 660. The network adapter 660 can communicate with other modules of the electronic device 600 through a bus 630. It should be understood that although not shown in the figure, other hardware and/or software modules can be used in conjunction with the electronic device 600, including but not limited to microcodes, device drivers, redundant processing units, external disk drive arrays, RAID systems, tape drives, data backup storage systems, etc.

Through the description of the above embodiments, it is easy for those skilled in the art to understand that the exemplary embodiments described here can be realized by software or by combining software with necessary hardware. The technical solutions according to the embodiments of the application may be embodied in the form of a software product, which may be stored in a non-volatile storage medium (which may be a CD-ROM, USB flash drive, mobile hard drive, etc.) or on a network, and may include several instructions to enable a computing device (which may be a personal computer, server, mobile terminal, or network device, etc.) to execute the method according to the embodiments of the application.

A software product can adopt any combination of one or more readable media. The readable medium may be a readable signal medium or a readable storage medium. The readable storage medium can be, for example, but is not limited to, an electrical, magnetic, optical, electromagnetic, infrared, or semiconductor system, apparatus or device, or a combination of any of the above. More specific examples (a non-exhaustive list) of readable storage media include: electrical connection with one or more wires, a portable disk, a hard disk, a random access memory (RAM), a read-only memory (ROM), an erasable programmable read-only memory (EPROM or flash memory), an optical fiber, a portable compact disk read-only memory (CD-ROM), an optical storage device, a magnetic storage device, or any suitable combination of the above.

The computer-readable storage medium may be a data signal propagated in a baseband or as part of a carrier wave, in which a readable program code is contained. This propagated data signal can take many forms, including but not limited to electromagnetic signal, optical signal or any suitable combination of the above. The readable storage medium may also be any readable medium other than the readable storage medium, which can send, propagate or transmit a program for use by or in combination with an instruction execution system, apparatus or device. The program code contained in the readable storage medium can be transmitted by any suitable medium, including but not limited to Wi-Fi, wire, optical cable, RF, etc., or any suitable combination of the above.

Computer program codes for performing the operations of the disclosure can be written by a combination of one or more programming languages, including object-oriented programming languages such as Java, C++, and conventional procedural programming languages such as "C" language or similar programming languages. The program code can be completely executed on user computing equipment, partially executed on user equipment, executed as an independent software package, partially executed on user computing equipment and partially executed on remote computing equipment, or completely executed on remote computing equipment or a server. In a case involving remote computing equipment, the remote computing equipment may be connected to user computing equipment through any kind of network including a local area network (LAN) or a wide area network (WAN), or may be connected to external computing equipment (e.g., connected through the Internet using an Internet service provider).

The computer-readable medium carries one or more programs, which, when executed by the said device, cause the computer-readable medium to realize the aforementioned functions.

Those skilled in the art can understand that the above modules can be distributed in devices according to the description of the embodiment, or can be uniquely arranged in one or more devices of this embodiment with corresponding changes. The modules in the above embodiments can be merged into one module or further split into multiple submodules.

According to some embodiments of the application, the technical solution of the application improves an existing hardware circuit, adds the HPD signal delay control circuit, and sets the HPD signal to a high level as soon as possible on the basis of effective communication between the computer host and the display, thus solving the problem that the BIOS screen cannot be displayed normally.

The embodiments of the application have been introduced in detail above. The above embodiments are only used to help understand the method of the application and its core ideas. The changes or deformations made by those skilled in the art based on the ideas of the application and the specific implementation and application scope of the application are within the scope of protection of the application. To sum up, the content of this specification should not be construed as a limitation of the application.

What is claimed is:

1. An HPD circuit of a display, comprising:
a main control module configured to receive a first control signal from the display, generate a first detection signal based on the first control signal, and output the first detection signal to a display interface; and
a delay control module configured to receive a second control signal from the display, generate a second detection signal based on the second control signal, set the second detection signal to a high level, and output the second detection signal to the display interface,
wherein the delay control module comprises a first switch submodule and a second switch submodule, and the first switch submodule is electrically connected with the second switch submodule.

2. The circuit according to claim 1, wherein
the first control signal and the second control signal are sent out at a same time after the display is power on;
the first control signal and the second control signal are both at a low level before the first detection signal is set to a high level;
the first control signal and the second control signal are both at a high level after the first detection signal is set to a high level; and
the second control signal maintains a high level state after the first detection signal is set to a high level.

3. The circuit according to claim 2, wherein
when the first control signal and the second control signal are both at a low level, the delay control module operates; and
when the first control signal and the second control signal are both at a high level, the delay control module is turned off.

4. The circuit according to claim 1, wherein the main control module comprises a first resistor, a third resistor and a first access port;
the first access port is electrically connected with an HPD receiving pin of the display interface through the third resistor and receives the first control signal; and
the first resistor is grounded, and the HPD receiving pin of the display interface is grounded through the first resistor.

5. The circuit according to claim 1, wherein the first switch submodule comprises a power supply, a first MOS switch tube, a first switch tube, a second resistor, a fifth resistor, a sixth resistor and a second access port;
the second access port is electrically connected with a base of the first switch tube through the sixth resistor and receives the second control signal;
the base of the first switch tube serves as a control port of the first switch tube and is grounded through the fifth resistor;
an emitter of the first switch tube serves as an input port of the first switch tube and is electrically connected with a drain of the first MOS switch tube;
a collector of the first switch tube serves as an output port of the first switch tube and is electrically connected with the display interface through the second resistor; and
a source of the first MOS switch tube is electrically connected with the power supply, and a gate of the first MOS switch tube is electrically connected with a collector of a second switch tube of the second switch submodule.

6. The circuit according to claim 5, wherein when the first MOS switch tube is in an off state, the emitter of the first switch tube is reversely biased so that the first switch tube is in the off state;
when the first MOS switch tube is in a saturated on state and the second control signal is at a low level, the emitter of the first switch tube is forward biased, and the second resistor, the fifth resistor and the sixth resistor are adjusted to make the first switch tube in an on state, so that the delay control module sets the second detection signal to a high level based on the second control signal; and when the first MOS switch tube is in a saturated on state and the second control signal is at a high level, the emitter of the first switch tube is reversely biased so that the first switch tube is in an off state.

7. The circuit according to claim 1, wherein the second switch submodule comprises a power supply, a fourth resistor, a seventh resistor, an eighth resistor, a second switch tube, a first capacitor and a second capacitor;

a base of the second switch tube is grounded through the first capacitor and the fourth resistor, and the base of the second switch tube serves as a control port of the second switch tube;

a collector of the second switch tube serves as an output port of the second switch tube, and the collector of the second switch tube is electrically connected with a gate of the first MOS switch tube of the first switch submodule;

an emitter of the second switch tube is grounded, and is connected with the power supply and a source of the first MOS switch tube of the first switch submodule through the second capacitor; and the power supply is electrically connected with a collector of the second switch tube through the eighth resistor, and is electrically connected with the base of the second switch tube through the seventh resistor.

8. The circuit according to claim 7, wherein when the second switch tube is in an off state, the first MOS switch tube is in an off state;

when the second switch tube is in a saturated on state, the first MOS switch tube is in an on state; and an on-time of the second switch tube is controlled by a control port of the second switch tube, and a working time of the delay control module is controlled by using the on-time of the second switch tube.

9. The circuit according to claim 8, wherein the working time of the delay control module comprises:

time for the delay control module to set the second detection signal to a high level after the display is power on; and time from a moment that the second detection signal is set to a high level to a moment that the first detection signal is set to a high level.

10. A working method applied to the HPD circuit of a display according to claim 1, the circuit comprising a main control module and a delay control module, the method comprising:

determining a working state of the delay control module according to a level of a first control signal and/or a second control signal sent from the display;

controlling the delay control module to generate and output a second detection signal according to the second control signal when the delay control module is in a working state; and controlling the main control module to generate and output a first detection signal according to the first control signal when the delay control module is in an off state.

11. The method according to claim 10, further comprising:

setting, by the delay control module, the level of the second detection signal to a high level when the delay control module operates; and setting, by the main control module, the level of the first detection signal to a high level when the delay control module is turned off.

12. The method according to claim 10, wherein controlling the delay control module to generate and output a second detection signal according to the second control signal sent out by the display when the delay control module is in a working state comprises:

adjusting a resistance value of at least one resistor in the delay control module, so that the delay control module is in a saturated on state;

generating and outputting the second detection signal; and adjusting a capacitor in the delay control module to control the working time of the delay control module.

13. An integrated circuit, comprising the HPD circuit according to claim 1.

\* \* \* \* \*